United States Patent
Sakamoto et al.

(10) Patent No.: US 9,852,942 B2
(45) Date of Patent: Dec. 26, 2017

(54) SEMICONDUCTOR MEMORY DEVICE AND METHOD FOR MANUFACTURING THE SAME

(71) Applicant: Toshiba Memory Corporation, Minato-ku (JP)

(72) Inventors: Wataru Sakamoto, Yokkaichi (JP); Hideki Inokuma, Yokkaichi (JP); Osamu Matsuura, Kuwana (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days.

(21) Appl. No.: 15/201,935

(22) Filed: Jul. 5, 2016

(65) Prior Publication Data

US 2017/0194254 A1  Jul. 6, 2017

Related U.S. Application Data

(60) Provisional application No. 62/272,736, filed on Dec. 30, 2015.

(51) Int. Cl.
*H01L 21/00* (2006.01)
*H01L 21/768* (2006.01)
*H01L 27/11568* (2017.01)
*H01L 27/11582* (2017.01)

(52) U.S. Cl.
CPC .. *H01L 21/76877* (2013.01); *H01L 21/76816* (2013.01); *H01L 27/11568* (2013.01); *H01L 27/11582* (2013.01)

(58) Field of Classification Search
CPC ......... H01L 21/76877; H01L 27/11568; H01L 21/76816
See application file for complete search history.

(56) References Cited

U.S. PATENT DOCUMENTS

| | | | | |
|---|---|---|---|---|
| 8,569,829 | B2* | 10/2013 | Kiyotoshi | H01L 27/11575 257/326 |
| 8,829,593 | B2* | 9/2014 | Sekine | H01L 27/11551 257/324 |
| 9,165,937 | B2* | 10/2015 | Yip | H01L 27/115 |
| 9,406,609 | B1* | 8/2016 | Lung | H01L 21/76816 |
| 9,425,207 | B2* | 8/2016 | Yasuda | G11C 16/14 |
| 9,704,877 | B2* | 7/2017 | Yamashita | H01L 27/11582 |
| 2010/0019310 | A1 | 1/2010 | Sakamoto | |

(Continued)

*Primary Examiner* — Laura Menz
(74) *Attorney, Agent, or Firm* — Oblon, McClelland, Maier & Neustadt, L.L.P.

(57) ABSTRACT

According to one embodiment, a semiconductor memory device includes a substrate, a stacked body, and a plurality of columnar parts. The stacked body is provided on the substrate. The stacked body includes a plurality of electrode films stacked separately from each other. The plurality of columnar parts is provided in the stacked body. Each of the plurality of columnar parts includes a semiconductor pillar extending in a stacking direction of the stacked body, and a charge storage film provided between the semiconductor pillar and the stacked body. The plurality of electrode films includes a first electrode film provided in upper layers of the stacked body and a second electrode film provided in lower layers of the stacked body. A thickness of the first electrode film is thicker than a thickness of the second electrode film. The first electrode film is provided with a void.

6 Claims, 10 Drawing Sheets

(56) References Cited

U.S. PATENT DOCUMENTS

| | | | |
|---|---|---|---|
| 2013/0161629 A1* | 6/2013 | Han | H01L 29/66833 257/66 |
| 2015/0318301 A1* | 11/2015 | Lee | H01L 29/7926 257/324 |
| 2016/0225783 A1* | 8/2016 | Ishibashi | H01L 27/1157 |
| 2016/0268293 A1* | 9/2016 | Kamigaichi | H01L 27/11582 |
| 2016/0276363 A1* | 9/2016 | Fukuzumi | H01L 27/11565 |
| 2016/0336338 A1* | 11/2016 | Song | H01L 23/5226 |
| 2017/0133389 A1* | 5/2017 | Yun | H01L 23/5226 |
| 2017/0194254 A1* | 7/2017 | Sakamoto | H01L 27/11568 |

\* cited by examiner

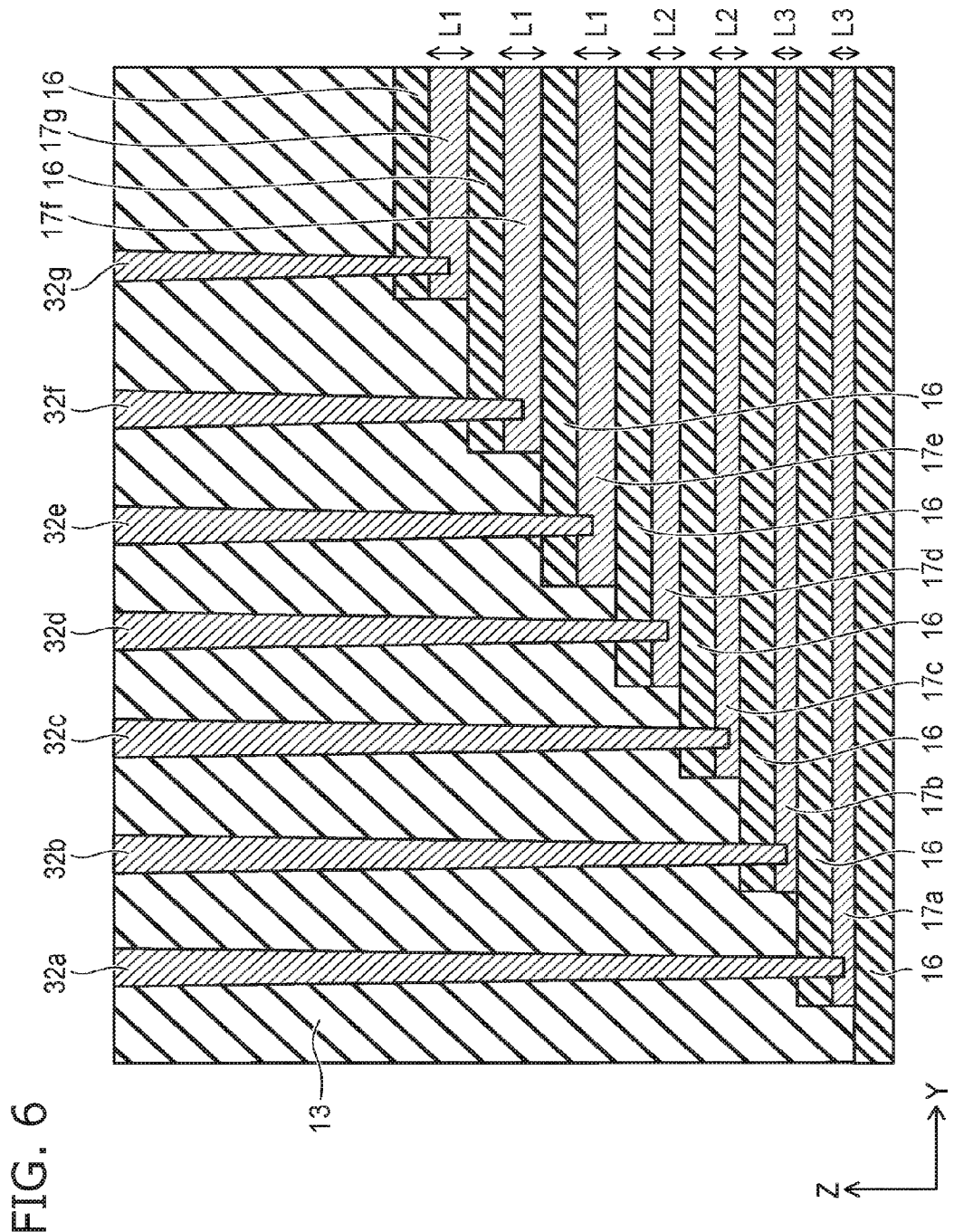

SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 62/272,736, filed on Dec. 30, 2015; the entire contents of which are incorporated herein by reference.

FIELD

Embodiments described herein relate generally to a semiconductor memory device and a method for manufacturing the same.

BACKGROUND

There has been proposed a memory device having a three-dimensional structure in which a stacked body having a plurality of electrode films stacked via respective insulating films is provided with memory holes, and a silicon body to be a channel is disposed on a sidewall of each of the memory holes via a charge storage film. The electrode films each function as a control gate in the memory cell, and by increasing the number of electrode films stacked, the number of memory cells can be increased. Due to the increase in the number of the electrode films stacked, the fact that it is difficult to form the memory hole can be cited as a concern.

BRIEF DESCRIPTION OF THE DRAWINGS

FIG. 6 is an enlarged cross-sectional view showing a part of the semiconductor memory device according to the first embodiment;

DETAILED DESCRIPTION

Figure 1:
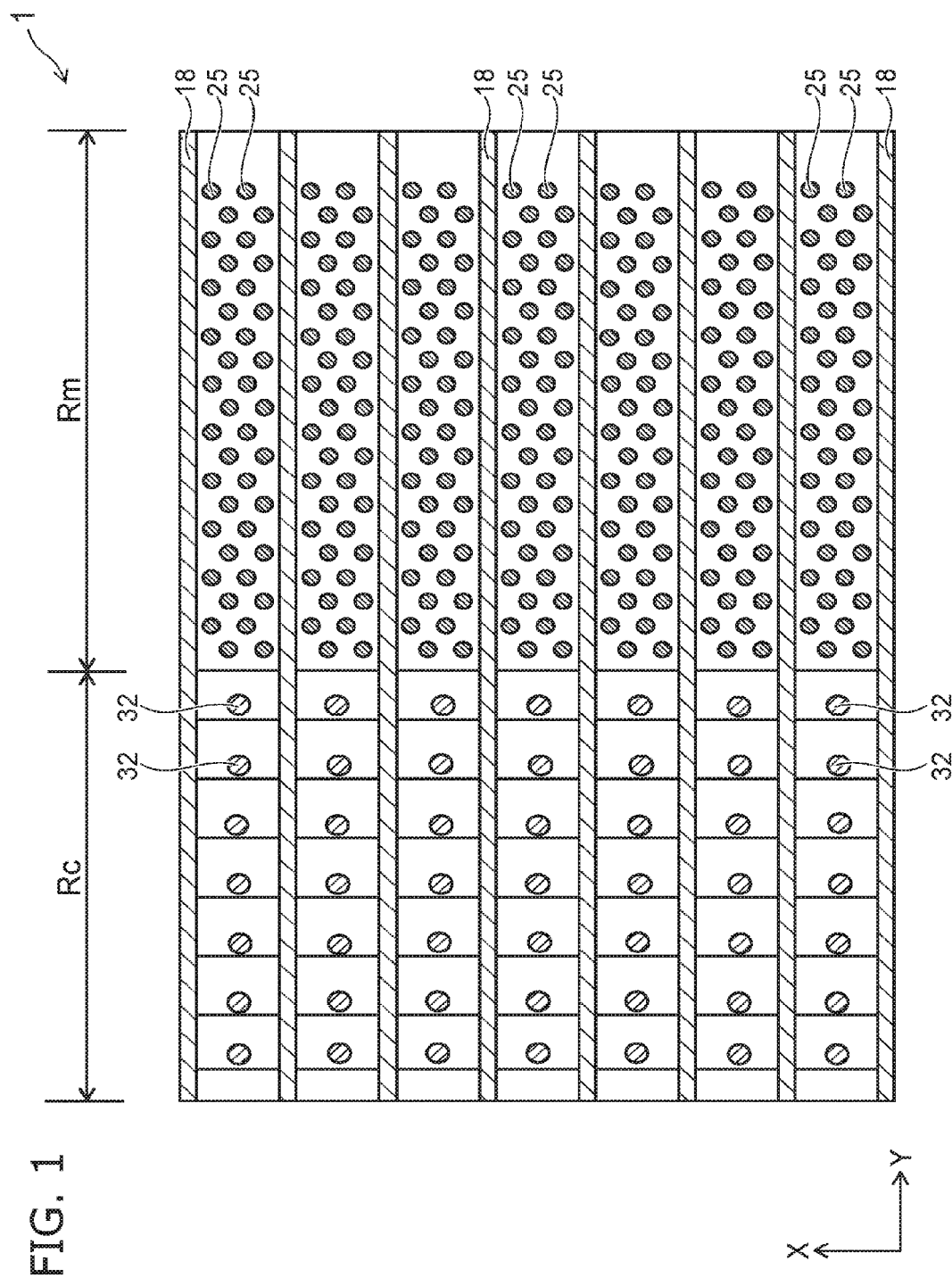
FIG. 1 is a schematic plan view showing a semiconductor memory device according to a first embodiment.

According to one embodiment, a semiconductor memory device includes a substrate, a stacked body, and a plurality of columnar parts. The stacked body is provided on the substrate. The stacked body includes a plurality of electrode films stacked separately from each other. The plurality of columnar parts is provided in the stacked body. Each of the plurality of columnar parts includes a semiconductor pillar extending in a stacking direction of the stacked body, and a charge storage film provided between the semiconductor pillar and the stacked body. The plurality of electrode films includes a first electrode film provided in upper layers of the stacked body and a second electrode film provided in lower layers of the stacked body. A thickness of the first electrode film is thicker than a thickness of the second electrode film. The first electrode film is provided with a void.

Various embodiments will be described hereinafter with reference to the accompanying drawings. In the respective drawings, the same elements are labeled with like reference numerals. All of drawings shown in the following are schematic. For example, for convenience to see the drawings, in some drawings, some constituent features are omitted or the number of the constituent features is reduced for drawing. The number and dimension ratio of the respective constituent features are not always consistent among drawings.

First Embodiment

FIG. 1 is a schematic plan view showing a semiconductor memory device according to a first embodiment.

Figure 2:
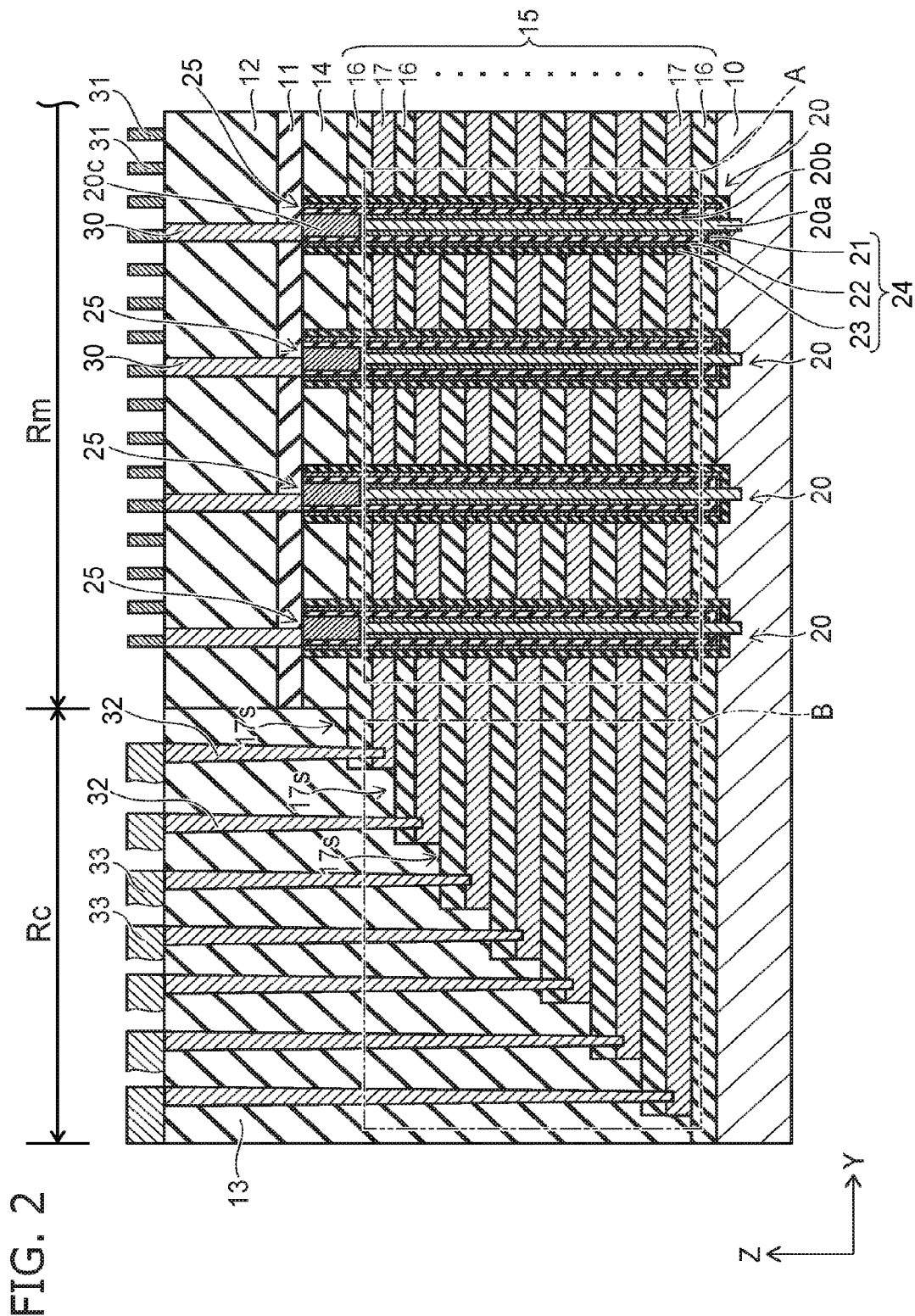
FIG. 2 is a schematic cross-sectional view showing the semiconductor memory device according to the first embodiment.

FIG. 2 is a schematic cross-sectional view showing the semiconductor memory device according to the first embodiment.

Figure 3:
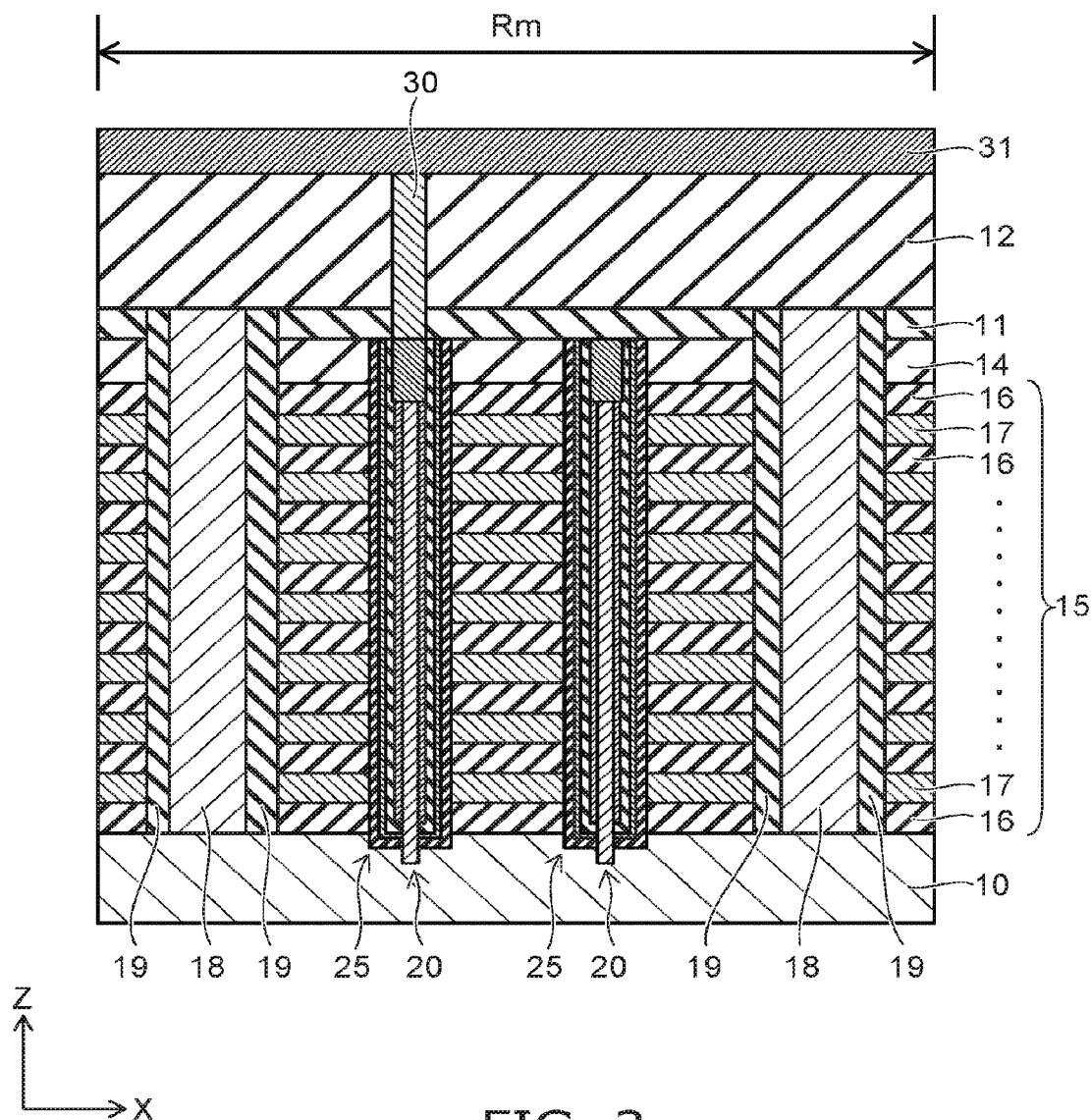
FIG. 3 is a schematic cross-sectional view showing a part of the semiconductor memory device according to the first embodiment.

FIG. 3 is a schematic cross-sectional view showing a part of the semiconductor memory device according to the first embodiment.

FIG. 1 shows a plan view of the semiconductor memory device 1. FIG. 2 shows a Y-Z cross-sectional view of the semiconductor memory device 1. FIG. 3 shows an X-Z cross-sectional view of a memory cell area Rm of the semiconductor memory device 1.

In the semiconductor memory device 1 according to the embodiment, a substrate 10 formed of a silicon substrate or the like is disposed. Hereinafter, in the specification, for the sake of convenience of explanation, there is adopted an XYZ Cartesian coordinate system. Two directions parallel to an upper surface of the substrate 10, and perpendicular to each other are defined as an "X-direction" and a "Y-direction," and a direction perpendicular to the upper surface of the substrate 10 is defined as a "Z-direction."

As shown in FIG. 1 and FIG. 2, the semiconductor memory device 1 is provided with a memory cell area Rm, and a contact area Rc. The memory cell area Rm and the contact area Rc are arranged along the Y-direction.

Hereinafter, the memory cell area Rm will be described.

The memory cell area Rm is provided with a stacked body 15 and silicon pillars 20 (semiconductor pillars). The stacked body 15 is provided on the substrate 10. In the stacked body 15, two or more insulating films 16 and two or more electrode films 17 are alternately stacked layer by layer in the Z-direction, and an interlayer insulating film 14 is provided on the uppermost one of the insulating films 16. The insulating films 16 are each formed of, for example, a silicon oxide ($SiO_2$). The electrode films 17 are each provided with a main body part made of, for example, tungsten (W), molybdenum (Mo), or cobalt (Co), and a barrier metal layer made of, for example, a titanium nitride and covering a surface of the main body part.

The silicon pillars 20 extend in the Z-direction. The silicon pillars 20 each penetrate the interlayer insulating film 14 and the stacked body 15, and each have contact with the substrate 10 in the lower end. As shown in FIG. 1, the silicon pillars 20 are arranged in a zigzag manner. The interlayer insulating film 14 is formed of, for example, a silicon oxide.

Each of the silicon pillars 20 is provided with a core part 20a having a columnar shape, located in the stacked body 15, and constituting a central part of the silicon pillar 20, a cover layer 20b having a cylindrical shape and provided on the periphery of the core part 20a, and a plug part 20c provided above the core part 20a and the cover layer 20b and located in the interlayer insulating film 14. The silicon pillars 20 are each formed of polysilicon as a whole. It should be noted that it is also possible for the core part 20a to have a cylindrical shape and to have an insulating member provided inside.

On the periphery of each of the silicon pillars 20, namely on the side surface of each of the silicon pillars 20, there is provided a tunnel insulating film 21. The tunnel insulating film 21 is, for example, a single layer silicon oxide film, or an ONO film having a silicon oxide layer, a silicon nitride layer, and a silicon oxide layer stacked on one another. On the periphery of the tunnel insulating film 21, there is provided a charge storage film 22. The charge storage film 22 is a film for storing the charge, and is formed of, for example, a material having trap sites of electrons, and is formed of, for example, a silicon nitride ($Si_3N_4$).

On the periphery of the charge storage film 22, there is provided a block insulating film 23. The block insulating film 23 is formed of, for example, a silicon oxide. The block insulating film 23 can also be a multilayer film formed of a silicon oxide layer and one of an aluminum oxide layer made of an aluminum oxide ($Al_2O_3$), a hafnium oxide layer made of a hafnium oxide ($HfO_x$), a zirconium oxide layer made of a zirconium oxide ($ZrO_x$), and a lanthanum oxide layer made of a lanthanum oxide ($LaO_x$) provided between the silicon oxide layer and the electrode films 17. The tunnel insulating film 21, the charge storage film 22, and the block insulating film 23 constitute a memory film 24 capable of storing the charge. Therefore, the memory film 24 is disposed between the silicon pillar 20 and the electrode films 17. Further, the silicon pillar 20 and the memory film 24 constitute a columnar part 25.

In the area immediately above the silicon pillar 20, there is provided a plug 30 extending in the Z-direction and penetrating the insulating film 11 and the insulating film 12. The plug 30 is formed of an electrically conductive material such as tungsten. The insulating film 11 and the insulating film 12 are each formed of, for example, a silicon oxide. On the insulating film 12, there are provided bit lines 31 extending in the X-direction. Each of the bit lines 31 is connected to one of the silicon pillars 20 in each of the stacked bodies 15 via one of the plugs 30.

As shown in FIG. 3, on the substrate 10, there is provided a plurality of source electrodes 18. The plurality of source electrodes 18 is provided to the memory cell area Rm and the contact area Rc. The source electrodes 18 are each formed of a metal material made of, for example, tungsten, molybdenum, or cobalt. The source electrodes 18 can each include a main body part formed of the metal material and a barrier metal layer covering a surface of the main body part.

The source electrodes 18 are arranged along the X-direction at regular intervals so as to be separated from each other, and extend in the Y-direction. The lower ends of the respective source electrodes 18 have contact with the substrate 10. For example, the source electrodes 18 are each provided so that the width in the X-direction of the upper end and the width in the X-direction of the lower end are equal to each other.

In each of areas each located between adjacent two of the source electrodes 18 in the X-direction, there are provided the stacked body 15, the interlayer insulating film 14, and the insulating film 11 from the lower side toward the upper side in this order. The insulating film 11, the interlayer insulating film 14 and the stacked body 15 are sectioned by the source electrodes 18, and extend in the Y-direction. Therefore, the insulating films 16 and the electrode films 17 also extend in the Y-direction.

Between a structure formed of the stacked body 15, the interlayer insulating film 14, and the insulating film 11, and the source electrode 18, there is provided a sidewall 19 having an insulating property. Due to the sidewall 19, the electrode films 17 are isolated from the source electrode 18. The sidewall 19 also extends in the Y-direction. The sidewall 19 is formed of, for example, a silicon oxide.

Hereinafter, the contact area Rc will be described.

In the contact area Rc, the shape of the end part of the stacked body 15 is a stepped shape, and steps 17s are formed in the respective electrode films 17. The insulating film 13 also covers the end part having the stepped shape of the stacked body 15, and the upper surface of the insulating film 13 is flat. The insulating film 13 is formed of, for example, a silicon oxide.

On each of the steps 17s of the stacked body 15, there is provided a contact 32. Each of the contacts 32 extends in the Z-direction, and penetrates the insulating film 13 and the insulating film 16. The lower end of the contact 32 is connected to the electrode film 17. Although in the present embodiment, one contact 32 is connected to each of the electrode films 17, it is also possible to connect two or more contacts 32 to each of the electrode films 17.

On the insulating film 13, there are disposed a plurality of upper-layer word lines 33 extending in the Y-direction. The upper end of the contact 32 is connected to the upper-layer word lines 33. Therefore, the electrode films 17 are connected to the upper-layer word lines 33 via the contacts 32, respectively.

It should be noted that although in FIG. 2, for the sake of convenience of illustration, a plurality of contacts 32 is drawn in the same Y-Z cross-sectional surface, in reality, the plurality of contacts 32 connected to the respective electrode films 17 different from each other is disposed at respective positions different from each other in the X-direction. Therefore, one upper-layer word line 33 shown in FIG. 2 is connected to one electrode film 17 alone via the contact 32.

In the memory cell area Rm, the silicon pillars 20 are connected between the substrate 10 and the respective bit lines 31. Further, in each of the electrode films 17, a plurality of blocks is arranged in the X-Y plane to form a part of the wiring pattern. Further, each of the blocks corresponds to a part between the source electrodes 18 adjacent to each other, and forms a word line as a control gate. For example, in each of the blocks, there are arranged four lines of the silicon pillars 20 each including a plurality of silicon pillars 20 arranged in a predetermined direction. Each of the bit lines 31 extends throughout the plurality of blocks in the X-direction, and is connected to one of the silicon pillars 20 in each of the blocks. Further, in each of the intersection parts between the silicon pillars 20 and the electrode films 17, there is formed a memory cell including the memory film 24.

In the memory cell area Rm, a number of memory cells are arranged in a three-dimensional matrix along the X-direction, the Y-direction, and the Z-direction, and data can be stored in each of the memory cells. In contrast, in the contact area Rc, the electrode films 17 are extracted from the memory cell area Rm, and are connected to a peripheral circuit (not shown) via the contacts 32 and the upper-layer word lines 33, respectively.

The electrode films 17 and the columnar parts 25 will hereinafter be described.

Figure 4:
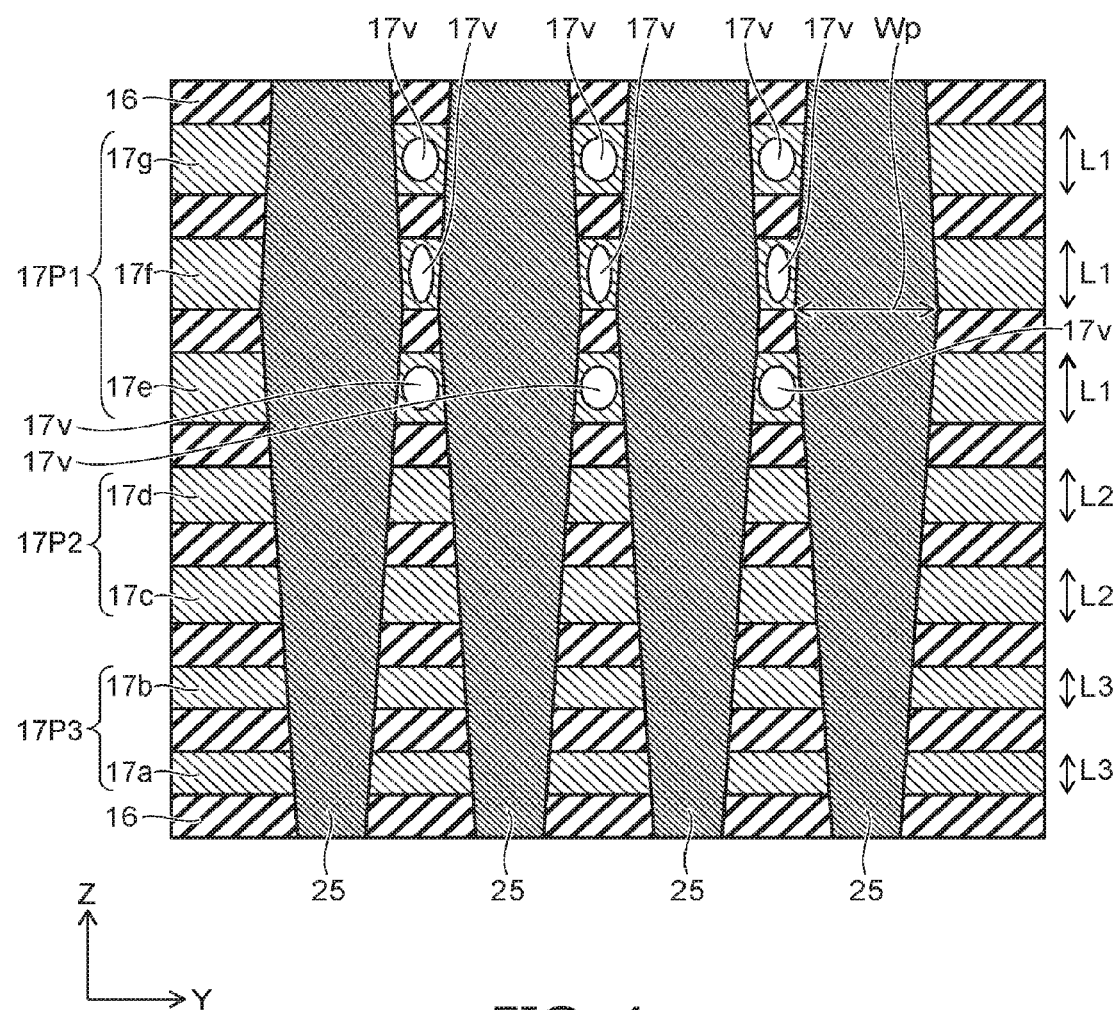
FIG. 4 is an enlarged cross-sectional view showing a part of the semiconductor memory device according to the first embodiment.

FIG. 4 is an enlarged cross-sectional view showing a part of the semiconductor memory device according to the first embodiment.

Figure 5A:
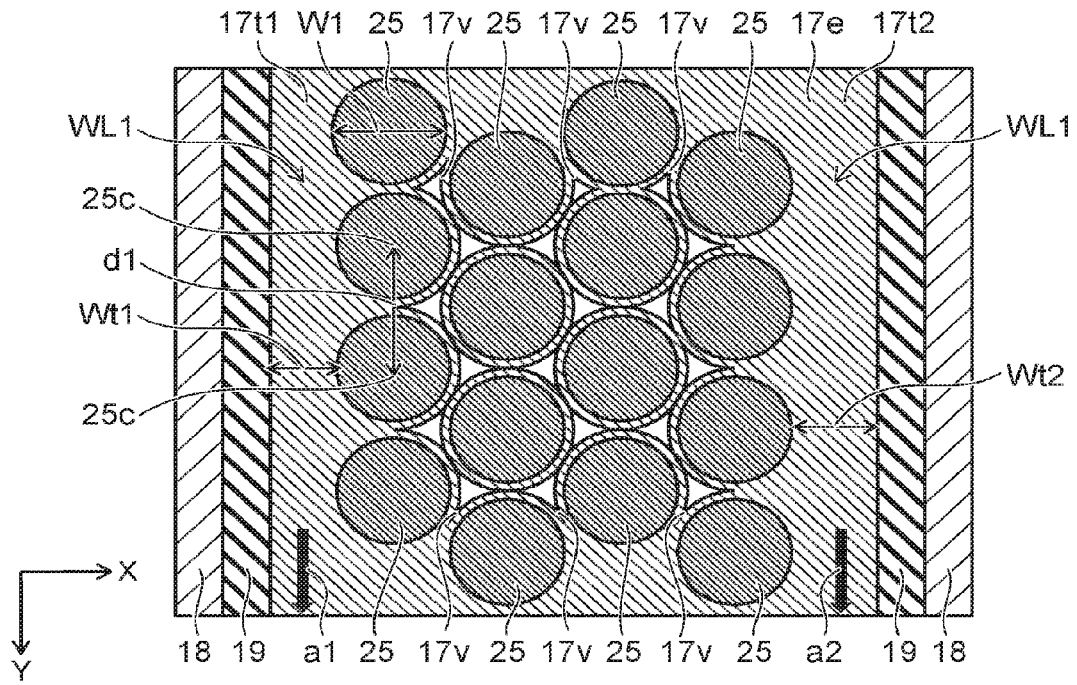
FIG. 5A and FIG. 5B are enlarged cross-sectional views showing parts of the semiconductor memory device according to the first embodiment.
Figure 5B:
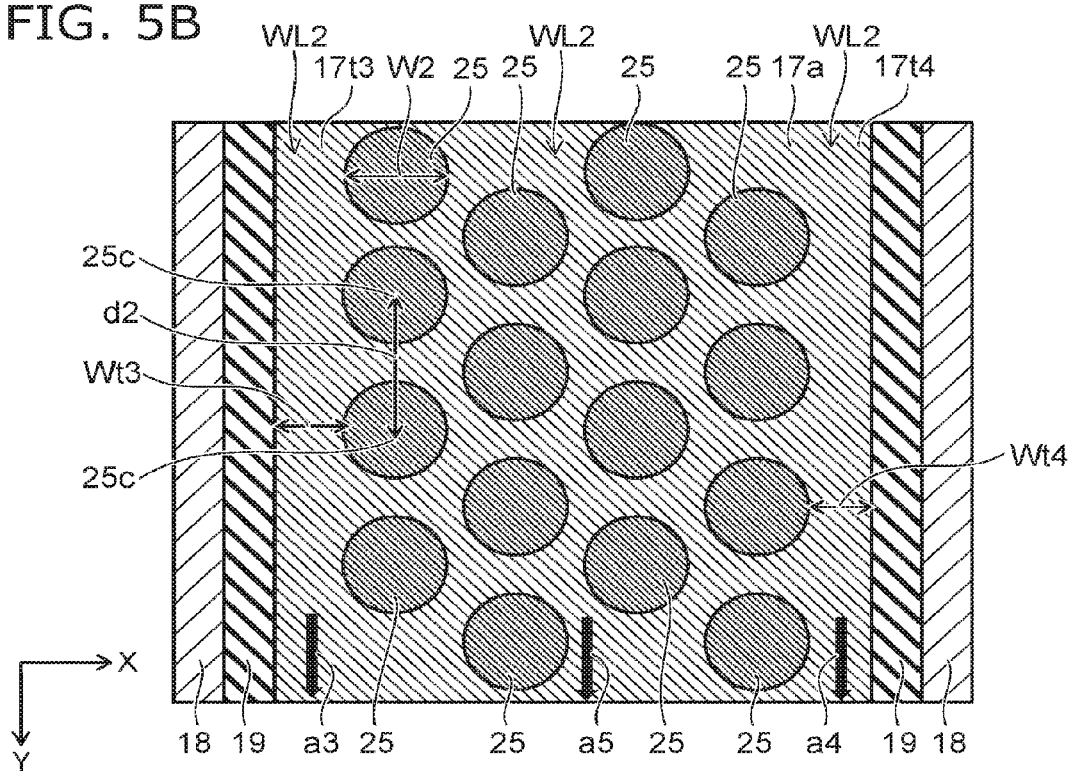

FIG. 5A and FIG. 5B are enlarged cross-sectional views showing parts of the semiconductor memory device according to the first embodiment.

FIG. 6 is an enlarged cross-sectional view showing a part of the semiconductor memory device according to the first embodiment.

FIG. 4 and FIG. 6 show enlarged views of an area A and an area B, respectively, shown in FIG. 2. FIG. 5A is an enlarged view of a part of the memory cell area Rm in FIG. 1, and shows the plurality of columnar parts 25 disposed in the electrode film 17e with the thickness of L1 shown in FIG. 4. FIG. 5B is an enlarged view of a part of the memory cell area Rm in FIG. 1, and shows the plurality of columnar parts 25 disposed in the electrode film 17a with the thickness of L3 shown in FIG. 4.

As shown in FIG. 4, the electrode films 17a through 17g are stacked in sequence in the Z-direction via the insulating films 16. In other words, the electrode films 17a through 17g are provided in sequence from the side near to the substrate 10. It should be noted that although in the example described hereinafter, the case in which the number of the electrode films 17 stacked is seven will be described, the number of the electrode films 17 stacked is arbitrary.

The electrode film 17a and the electrode film 17b are provided in the lower layers of the stacked body 15, and each have a thickness of, for example, L3. The electrode film 17c and the electrode film 17d each have a thickness of, for example, L2. The thickness L2 is thicker than the thickness L3. The electrode film 17e, the electrode film 17f, and the electrode film 17g are provided in the upper layers of the stacked body 15, and each have a thickness of, for example, L1. The thickness L1 is thicker than the thickness L2. In the case of dividing the stacked body 15 into two parts in the Z-direction, the upper layers and the lower layers of the stacked body 15 respectively correspond to parts located on the upper side and the lower side of the stacked body 15.

In the stacked body 15, the electrode film 17a and the electrode film 17b each having the thickness L3 constitute a set 17P3. Further, in the stacked body 15, the electrode film 17c and the electrode film 17d each having the thickness L2 constitute a set 17P2, and the electrode film 17e, the electrode film 17f, and the electrode film 17g each having the thickness L1 constitute a set 17P1.

The columnar parts 25 are each disposed so as to have a diameter different between the electrode films 17a through 17g. In FIG. 4, the columnar parts 25 are each disposed so that the width Wp in the Y-direction is different when viewed in the Y-Z cross-sectional surface. For example, the columnar parts 25 can each have a part with the largest diameter in the upper layers of the stacked body 15. For example, the columnar parts 25 can also be provided so that the diameter of each of the columnar parts 25 is the smallest at the lower end, increases toward the upper side, and becomes the largest at the upper end.

In each of the electrode films 17e through 17g each having the thickness L1, there are formed voids 17v. The voids 17v are each formed between the columnar parts 25 adjacent to each other, and disposed in the electrode films 17e through 17g. It should be noted that the "columnar parts adjacent to each other" denotes one of the columnar parts and another of the columnar parts having a central axis closest to the central axis of the one of the columnar parts.

The conditions in which the voids 17v are formed will hereinafter be described.

As shown in FIG. 5A, the plurality of columnar parts 25 is disposed in the electrode film 17e having the thickness L1. Assuming that the width of each of the columnar parts 25 is W1, and the distance between the central axes 25c of the respective columnar parts 25 adjacent to each other is d1, the voids 17v are formed in the electrode film 17e in the case in which the formula (1) below is fulfilled.

$$d1-W1<L1 \tag{1}$$

The voids 17v are each formed inside the electrode film 17e, and between the columnar parts 25 adjacent to each other. Inside the electrode film 17e, there are disposed the columnar parts 25, and the columnar part 25 is not disposed outside the electrode film 17e.

In the case in which the voids 17v are formed in the electrode film 17e, a current substantially flows in each of end parts 17t1, 17t2 of the electrode film 17e to form the word lines WL1. The arrow a1 and the arrow a2 each show the direction in which the current flows. It should be noted that the "end part of the electrode film" corresponds to a part located between the sidewall 19 and the columnar parts 25 the shortest in distance in the X-direction from the sidewall 19. For example, the widths in the X-direction of the end parts 17t1, 17t2 are denoted by Wt1, Wt2, respectively.

Further, in the case in which the conductance of the end part 17t1 and the conductance of the end part 17t2 are respectively defined as G1, G2, the resistance R1 of the word line WL1 is expressed as the formula (2) below.

$$R1=1/(G1+G2) \tag{2}$$

For example, in the case in which the columnar parts 25 are disposed in the electrode film 17e so that the width Wt1 in the X-direction of the end part 17t1 becomes equal to the width Wt2 in the X-direction of the end part 17t2, the resistance R1 is expressed as the formula (3) below.

$$R1=\tfrac{1}{2}G1 \tag{3}$$

As shown in FIG. 5B, the plurality of columnar parts 25 is disposed in the electrode film 17a having the thickness L3. Assuming that the width of each of the columnar parts 25 is W2, and the distance between the central axes 25c of the respective columnar parts 25 adjacent to each other is d2, the voids 17v are not formed in the electrode film 17a in the case in which the formula (4) below is fulfilled.

$$d2-W2 \geq L3 \tag{4}$$

In the case in which the voids 17v are not formed in the electrode film 17a, currents flow in each of end parts 17t3, 17t4 of the electrode film 17a and between the columnar parts 25 adjacent to each other to form the word lines WL2. The arrows a3 through a5 each show the direction in which the current flows. Since the voids 17v are not formed in the electrode film 17a, a part of the electrode 17a located between the columnar parts 25 functions as a part of the word line WL2.

For example, the widths in the X-direction of the end parts 17t3, 17t4 are denoted by Wt3, Wt4, respectively. For example, the columnar parts 25 are disposed in the electrode film 17a so that the width Wt3 in the X-direction of the end part 17t3 becomes equal to the width Wt4 in the X-direction of the end part 17t4. Further, in the case in which the conductance of the end part 17t3 and the conductance of the end part 17t4 are respectively defined as G3, G4, and the conductance of a part of the electrode film 17a disposed between the columnar parts 25 is defined as G5, the resistance R2 of the word line WL2 is expressed as the formula (5) below.

$$R2=1/(G3+G4+G5) \quad (5)$$

For example, in the case in which the columnar parts 25 are disposed in the electrode film 17a so that the width Wt3 in the X-direction of the end part 17t3 becomes equal to the width Wt4 in the X-direction of the end part 17t4, the resistance R2 is expressed as the formula (6) below.

$$R2=1/(2G3+G5) \quad (6)$$

For example, if the thicknesses L1 through L3 of the electrode films 17 are set so as to fulfill the formulas (1) and (4) described above, the voids 17v are formed in the electrode films 17 provided to the upper layers of the stacked body 15. In other words, the voids 17v are formed in the electrode films 17e through 17g each having the thickness L1, and the voids 17v are not formed in the electrode film 17c and the electrode film 17d each having the thickness L2 and the electrode film 17a and the electrode film 17b each having the thickness L3.

As shown in FIG. 6, the contacts 32a through 32g are provided to the end part of the stacked body 15 having the stepped shape. As described above, the electrode film 17a and the electrode film 17b each have the thickness L3, the electrode film 17c and the electrode film 17d each have the thickness L2, and the electrode film 17e, the electrode film 17f, and the electrode film 17g each have the thickness L1. The contacts 32a through 32g each penetrate the insulating film 13 and the insulating film 16, and are respectively connected to the electrode films 17a through 17g.

Although in the example described above, the thicknesses of the electrode films 17 are set in the three levels of L1 through L3, it is also possible to set the thicknesses of the electrode films 17 in four or more levels. In this case, the thicknesses L1 through L4 are set so that the thicknesses of the electrode films 17 decrease in a direction from the upper layer toward the lower layer. It is also possible to divide the thicknesses of the electrode films 17 into two levels corresponding respectively to the upper layers and the lower layers. In this case, the thicknesses of the electrode films 17 in the upper layers are set to be thicker than the thicknesses of the electrode films 17 in the lower layers.

The numbers of the electrode films 17 to be respectively set to the thicknesses L1, L2, and L3 are not limited to the example described above, but can be set to arbitrary numbers. For example, in the case in which the number of the electrode films 17 stacked is eight, the numbers of the electrode films 17 to be respectively set to the thicknesses L1, L2, and L3 can be set to two, three, and three, respectively. In the case in which the number of the electrode films 17 stacked is nine, the numbers of the electrode films 17 to be respectively set to the thicknesses L1, L2, and L3 can each be set to three.

Further, it is also possible to make the electrode films 17 constituting each of the sets 17P1 through 17P3 different in thickness from each other. For example, it is possible to set at least a part of the thicknesses of the electrode films 17e through 17g of the set 17P1 to be different, and to set the thicknesses of the electrode films 17a, 17b of the set 17P3 different from each other. In this case, the smallest one of the thicknesses of the electrode films 17e through 17g is thicker than the largest one of the thicknesses of the electrode films 17a, 17b.

Although in the example described above, the voids 17v are formed only in the electrode films 17e through 17g each having the thickness L1, the example is not a limitation. For example, in the case in which the number of the electrode films 17 stacked is seven, it is also possible for the voids 17v to be formed in the electrode films 17e through 17g each having the thickness L1 and the electrode film 17c and the electrode film 17d each having the thickness L2. In such a case, the thicknesses L1 through L3 of the electrode films 17 are set so as to fulfill the formulas (1) through (4) described above.

Advantages of the embodiment will hereinafter be described.

In the semiconductor memory device having a three-dimensional structure, the columnar parts are formed by forming the memory holes in the stacked body, and then embedding the silicon pillar and the memory film in each of the memory holes. The height of the stacked body increases as the number of the electrode films stacked increases, and it results that the aspect ratio of the memory hole increases. Therefore, due to the increase in the number of the electrode films stacked, it becomes difficult to form the memory holes in the stacked body.

Further, in the case in which the electrode films are formed of a metal material, since a stress such as a tensile stress or a compression stress becomes easy to occur, such a stress occurs on one side of the substrate, and the substrate warps greatly. The plurality of semiconductor memory devices is manufactured by forming the structure on a wafer including the substrate, and then dicing the wafer and the structure. Therefore, such a great warp of the wafer deteriorates the accuracy in the manufacturing process, and hinders the stable operation of the manufacturing device. Further, the wafer is broken due to the stress in some cases. Therefore, if the volume of each of the electrode films is increased in the X-Y-direction so as to decrease the aspect ratio of the memory hole, the warp of the wafer increases in accordance with the increase in volume of each of the electrode films.

Further, there is a possibility that the thickness of each of the electrode films is thinned as the number of the electrode films stacked increases. In the end part of the stacked body, the contacts are each formed by forming the contact hole and then embedding the metal material in the contact hole. In the case in which the thickness of each of the electrode films is thin, if the etching selectivity between the insulating film and the electrode film is low, there is a possibility that the contact hole to be connected to the electrode film penetrates the insulating film immediately below the electrode film. For example, in the electrode films provided in the upper layers of the stacked body, short circuit is easy to occur by the contact hole penetrating the insulating film located immediately below the electrode film.

In the embodiment, the thicknesses of the electrode films 17 provided in the upper layers of the stacked body 15 are made thicker than the thicknesses of the electrode films 17 provided in the lower layers. By providing the electrode films 17 in such a manner, the thickness in the Z-direction of the stacked body 15 can be decreased compared to the case in which the thicknesses in the Z-direction of the electrode films 17 are uniform. Thus, it is possible to lower the aspect ratio of the memory hole without increasing the volume of each of the electrode films in the X-Y-direction to suppress the warp of the wafer.

Further, the thicknesses of the electrode films 17 are set so that the voids 17v are formed in the electrode films 17 in the upper layers, and the voids 17v are not formed in the electrode films 17 in the lower layers. The resistance value of the electrode film 17 is determined by the thickness in the Z-direction of the electrode film 17 and the channel of the electrode film 17 based on the presence or absence of the void 17v. Thus, since the voids 17v are formed in the electrode films 17 in the upper layers relatively large in thickness, and the void 17v is not formed in the electrode films 17 in the lower layers relatively small in thickness, the difference between the resistance value of each of the electrode films 17 in the upper layers and the resistance value of each of the electrode films 17 in the lower layers can be made small. For example, in the electrode film 17a through the electrode film 17g described above, the difference between the value of the resistance R1 expressed by the formula (2) and the value of the resistance R2 expressed by the formula (5) described above is made small. Therefore, a problem due to the difference in memory operation characteristics between the memory cells dependent on the electrode films 17 can be inhibited.

Further, by making the thicknesses of the electrode films 17 in the upper layers thicker than the thicknesses of the electrode films 17 in the lower layers, it is possible to inhibit the contact hole to be formed in the electrode film 17 from penetrating the insulating film 16 immediately below the electrode film 17. Thus, it is possible to inhibit the short circuit occurring due to the penetration by the contact hole. Further, by decreasing the thickness in the Z-direction of the stacked body 15, the aspect ratio of each of the contact holes can be lowered. Even in the case in which the etching selectivity between the insulating films 16 and the electrode films 17 is low, a number of contact holes can be formed at a time.

Second Embodiment

Figure 7:
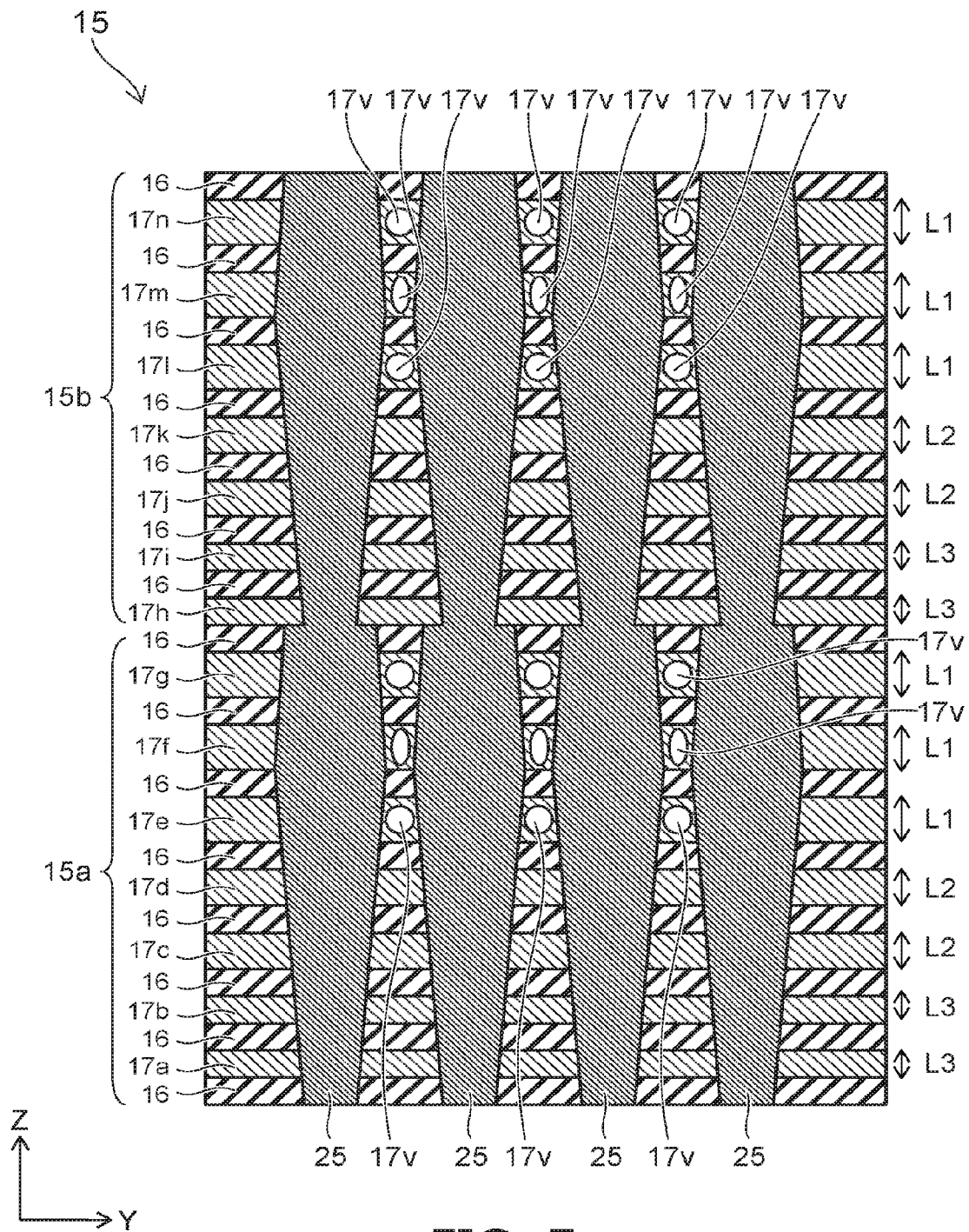
FIG. 7 is an enlarged cross-sectional view showing a part of a semiconductor memory device according to a second embodiment.

FIG. 7 is an enlarged cross-sectional view showing a part of a semiconductor memory device according to a second embodiment.

Figure 8:
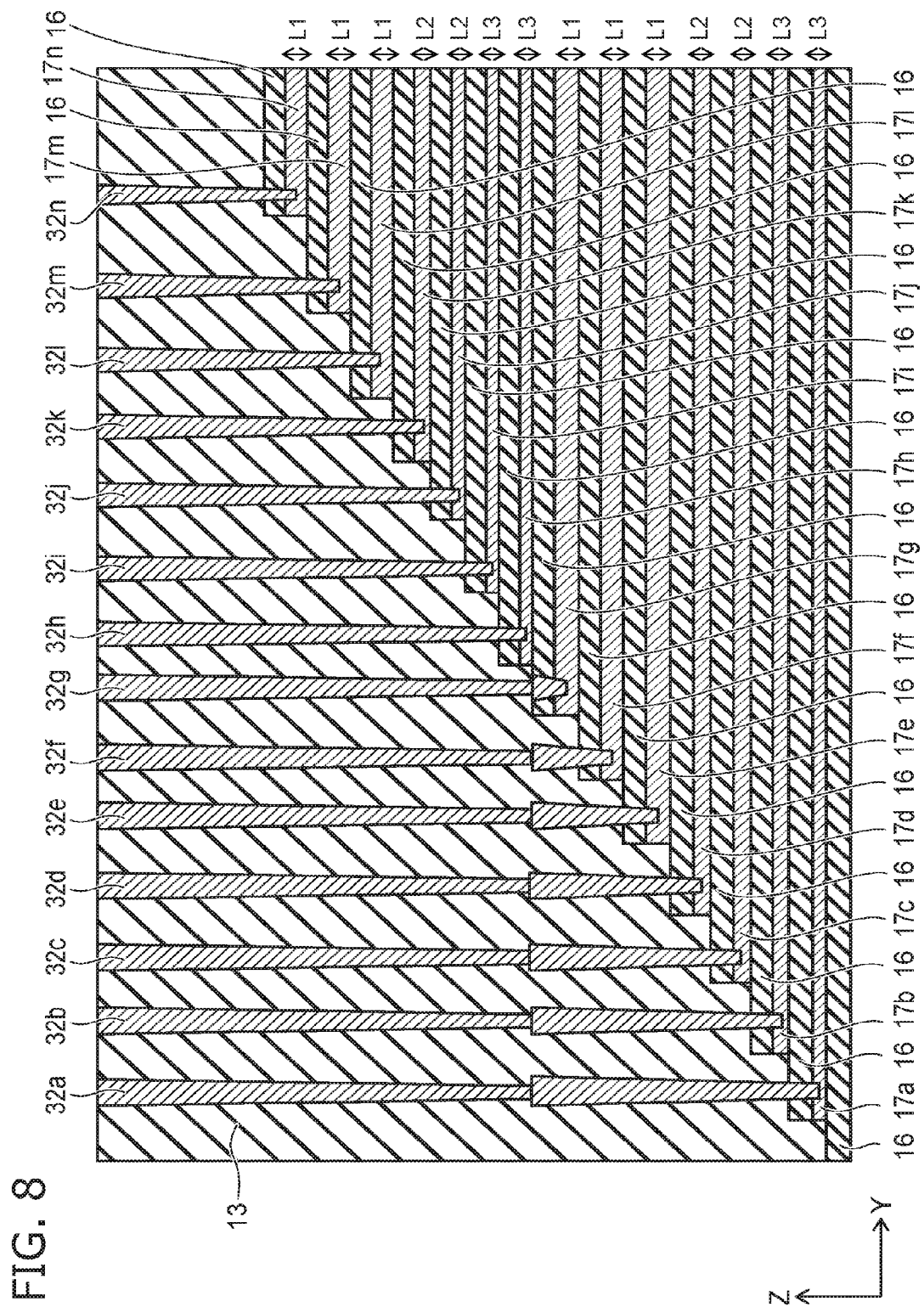
FIG. 8 is an enlarged cross-sectional view showing a part of the semiconductor memory device according to the second embodiment.

FIG. 8 is an enlarged cross-sectional view showing a part of the semiconductor memory device according to the second embodiment.

FIG. 7 and FIG. 8 are an enlarged view of a part of the memory cell area Rm, and an enlarged view of a part of the contact area Rc, respectively, and show the case in which the number of the electrode films 17 stacked is 14. FIG. 7 and FIG. 8 are diagrams corresponding respectively to FIG. 4 and FIG. 6.

The embodiment and the first embodiment are different in the electrode films 17 and the columnar parts 25. Since the constituents other than the electrode films 17 and the columnar parts 25 are the same as those in the first embodiment, the detailed description of the other constituents will be omitted.

As shown in FIG. 7, the electrode films 17a through 17n are stacked in sequence in the Z-direction via the insulating films 16. The electrode film 17a, the electrode film 17b, the electrode film 17h, and the electrode film 17i each have, for example, the thickness L3. The electrode film 17c, the electrode film 17d, the electrode film 17j, and the electrode film 17k each have, for example, the thickness L2. The thickness L2 is thicker than the thickness L3. The electrode film 17e, the electrode film 17f, the electrode film 17g, the electrode film 17l, the electrode film 17m, and the electrode film 17n each have, for example, the thickness L1. The thickness L1 is thicker than the thickness L2.

In each of the electrode films 17e through 17g and the electrode films 17l through 17n each having the thickness L1, there are formed the voids 17v. The voids 17v are each formed between the columnar parts 25 adjacent to each other, and disposed in the electrode films 17e through 17g and the electrode films 17l through 17n.

In the embodiment, a stacked body 15b having the electrode films 17h through 17n stacked in the Z-direction via the insulating films 16 is provided on a stacked body 15a having the electrode films 17a through 17g stacked in the Z-direction via the insulating films 16. For example, the configuration of the electrode films 17 in the stacked body 15b is the same as the configuration of the electrode films 17 in the stacked body 15a. By repeatedly forming the configuration of the electrode films 17 in the stacked body 15a in the Z-direction, the stacked body 15 can be formed on the substrate 10.

For example, if the thicknesses L1 through L3 of the electrode films 17 are set so as to fulfill the formulas (1) and (4) described above, the voids 17v are formed in the electrode films 17 provided to the upper layers of the stacked body 15a. Further, the voids 17v are formed in the electrode films 17 provided to the upper layers of the stacked body 15b. In other words, the voids 17v are formed in the electrode films 17e through 17g and the electrode films 17l through 17n each having the thickness L1, and the voids 17v are not formed in the electrode film 17c, the electrode film 17d, the electrode film 17j, and the electrode film 17k each having the thickness L2 and the electrode film 17a, the electrode film 17b, the electrode film 17h, and the electrode film 17i each having the thickness L3.

As shown in FIG. 8, the contacts 32a through 32n are provided to the end part of the stacked body 15 having the stepped shape. As described above, the electrode film 17a, the electrode film 17b, the electrode film 17h, and the electrode film 17i each have the thickness L3. The electrode film 17c, the electrode film 17d, the electrode film 17j, and the electrode film 17k each have the thickness L2. The electrode films 17e through 17g and the electrode films 17l through 17n each have the thickness L1. The contacts 32a through 32n each penetrate the insulating film 13 and the insulating film 16, and are respectively connected to the electrode films 17a through 17n.

Advantages of the embodiment will hereinafter be described.

In the embodiment, the thicknesses of the electrode films 17 provided in the upper layers of each of the stacked bodies 15a, 15b are made thicker than the thicknesses of the electrode films 17 provided in the lower layers. By providing the electrode films 17 in such a manner, the thickness in the Z-direction of the stacked body 15 can be decreased compared to the case in which the thicknesses in the Z-direction of the electrode films 17 are uniform. Thus, it is possible to lower the aspect ratio of the memory hole without increasing the volume of each of the electrode films in the X-Y-direction to suppress the warp of the substrate and the warp of the wafer.

Further, the thicknesses of the electrode films 17 are set so that the voids 17v are formed in the electrode films 17 in the upper layers of each of the stacked bodies 15a, 15b, and the voids 17v are not formed in the electrode films 17 in the lower layers. Thus, the difference between the resistance value of each of the electrode films 17 in the upper layers and the resistance value of each of the electrode films 17 in the lower layers can be made small in each of the stacked bodies 15a, 15b. Therefore, the problem due to the difference in memory operation characteristics between the memory cells dependent on the electrode films 17 can be inhibited.

Further, by making the thicknesses of the electrode films 17 in the upper layers thicker than the thicknesses of the electrode films 17 in the lower layers in each of the stacked bodies 15a, 15b, it is possible to inhibit the contact hole to be formed in the electrode film 17 from penetrating the insulating film 16 immediately below the electrode film 17. Thus, it is possible to inhibit the short circuit occurring due to the penetration by the contact hole. Further, by decreasing the thickness in the Z-direction of the stacked body 15, the aspect ratio of each of the contact holes can be lowered. Even in the case in which the etching selectivity between the insulating films 16 and the electrode films 17 is low, a number of contact holes can be formed at a time.

Hereinafter, a method of manufacturing the semiconductor memory device will be described.

Third Embodiment

FIG. 9A through FIG. 9D are diagrams showing the method of manufacturing the semiconductor memory device according to a third embodiment.

FIG. 9A through FIG. 9D each show a cross-sectional view showing the method of manufacturing the semiconductor memory device. The cross-sectional surface shown in each of FIG. 9A through FIG. 9D is a Y-Z cross-sectional surface of the semiconductor memory device 1, and corresponds to the cross-sectional surface shown in FIG. 4. It should be noted that in the following description, a method of manufacturing the memory cell area Rm of the semiconductor memory device 1 will be described.

Figure 9A:
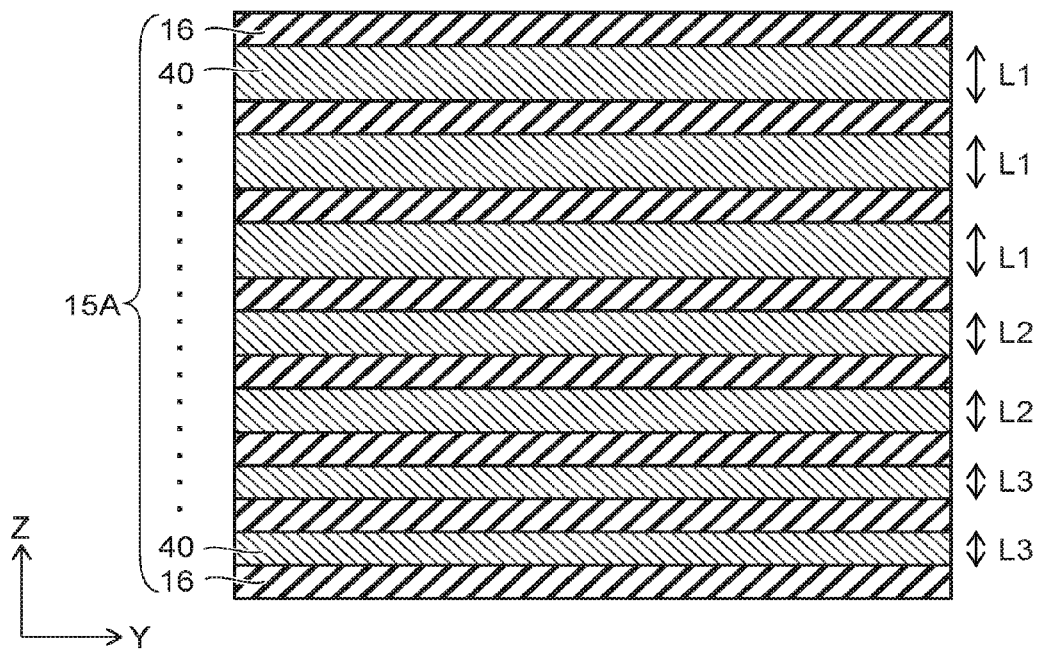
FIG. 9A to FIG. 9D are diagrams showing a method for manufacturing a semiconductor memory device according to a third embodiment.

As shown in FIG. 9A, the insulating films 16 and sacrificial films 40 are alternately stacked on one another along the Z-direction using, for example, a CVD (Chemical Vapor Deposition) method to form the stacked body 15A on the substrate 10 as a part of the wafer. The sacrificial films 40 are formed of a material capable of providing a sufficient etching selectivity with the insulating films 16, and are each formed of, for example, a silicon nitride. The sacrificial films 40 are formed so that the thickness in the Z-direction in the upper layers of the stacked body 15A is thicker than that in the lower layers. For example, the thicknesses of the sacrificial films 40 are each set to any one of the thicknesses L3 through L1. The thickness L1 is thicker than the thickness L2, and the thickness L2 is thicker than the thickness L3.

Figure 9B:
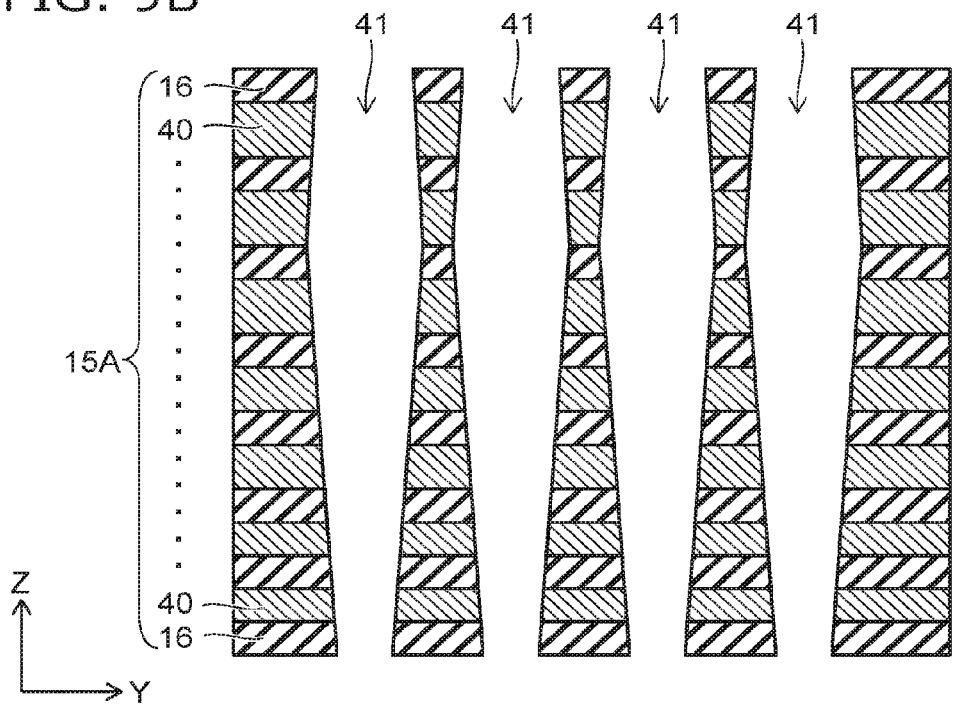

Then, as shown in FIG. 9B, a plurality of memory holes 41 (through holes) is formed in the stacked body 15A using, for example, RIE (Reactive Ion Etching). It should be noted that in the contact area Rc, the end part of the stacked body 15A is processed so as to have the stepped shape to form a step in each of the sacrificial films 40.

After forming the memory holes 41 in the stacked body 15A, it is possible to further form the stacked body by alternately stacking the sacrificial films 40 and the insulating films 16 along the Z-direction. In either of the two stacked bodies, the sacrificial films 40 are formed so that the thickness in the Z-direction in the upper layers is thicker than that in the lower layers. Subsequently, alignment with the memory holes 41 having been formed in the lower stacked body (the stacked body 15A) is performed, and then the memory holes 41 are formed in the upper stacked body. The memory holes 41 of the upper stacked body are formed using, for example, a photolithography method. It should be noted that in such a case, in the contact area Rc, after processing the lower stacked body so as to have the stepped shape and then forming the contact holes, the upper stacked body is formed and is then processed so as to have the stepped shape.

Figure 9C:
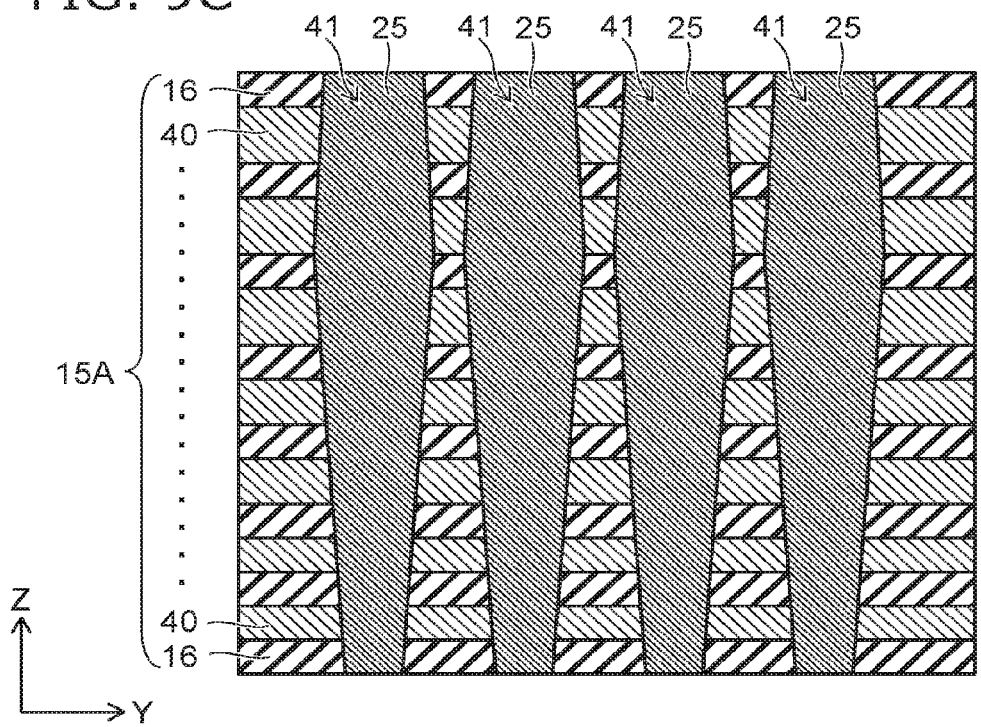

Then, as shown in FIG. 9C, the silicon oxide is deposited on the inner surface of each of the memory holes 41 to form the block insulating film 23 using, for example, the CVD method, subsequently, the silicon nitride is deposited to form the charge storage film 22, the silicon oxide, for example, is deposited to form the tunnel insulating film 21, and then silicon is deposited to form the cover layer 20b. Subsequently, by performing RIE, the cover layer 20b, the tunnel insulating film 21, the charge storage film 22, and the block insulating film 23 are removed from the bottom surface of each of the memory holes 41 to thereby expose the substrate 10. Subsequently, silicon is deposited to form the core part 20a. The core part 20a reaches the substrate 10, and then has contact with the substrate 10. Subsequently, etch-back is performed to remove the upper parts of the cover layer 20b and the core part 20a, and then silicon doped with an impurity is embedded to form the plug part 20c. Thus, the columnar part 25 having the silicon pillar 20 and the memory film 24 is formed in each of the memory holes 41.

Figure 9D:
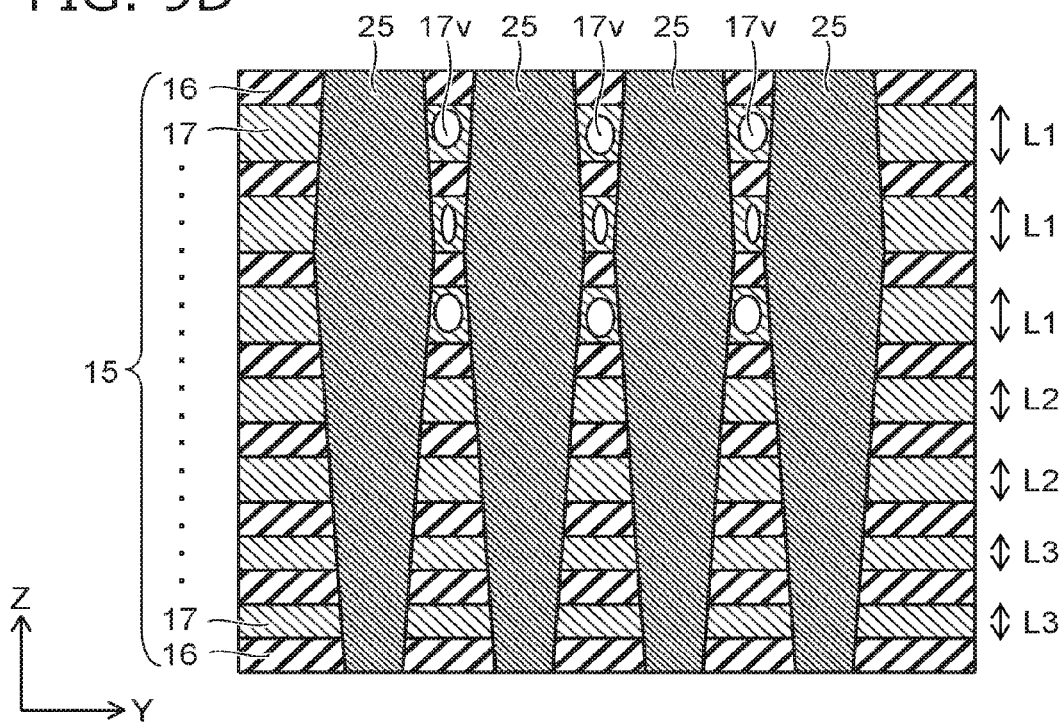

Then, as shown in FIG. 9D, a plurality of slits (not shown) extending in the Y-direction is provided to the stacked body using anisotropic etching such as RIE. The slits are made to penetrate the stacked body. Thus, the stacked body 15A is segmentalized by the slits into a plurality of stacked bodies extending in the Y-direction. Subsequently, wet-etching is performed via the slits to thereby remove the sacrificial films 40. By removing the sacrificial films 40 via the slits, hollows are formed. Subsequently, conductive films made of tungsten, molybdenum, cobalt, or the like are deposited via the slits to fill the hollows. Thus, the electrode films 17 are formed. The sacrificial films 40 are replaced with the electrode films 17, and thus, the stacked body 15 is formed between the slits. The electrode films 17 are formed so that the thickness in the Z-direction in the upper layers of the stacked body 15 is thicker than that in the lower layers. For example, the thicknesses of the electrode films 17 are each set to any one of the thicknesses L3 through L1. The thickness L1 is thicker than the thickness L2, and the thickness L2 is thicker than the thickness L3. Further, the voids 17v are formed in the electrode films 17 in the upper layers, and the voids 17v are not formed in the electrode films 17 in the lower layers.

Subsequently, the sidewall 19 is formed on the side surface of each of the slits, and then, tungsten, molybdenum, or cobalt is thickly deposited to form the source electrodes 18.

It should be noted that in the contact area Rc, the contact holes are formed in the end part of the stacked body 15, and then a metal material or the like is embedded in each of the contact holes to thereby form the contacts 32. For example, in the case in which there is formed the stacked body 15 having the stacked body 15a and the stacked body 15b, the alignment with the contact holes having already been provided to the stacked body 15a is performed, and then the contact holes are provided to the stacked body 15a and the stacked body 15b. The contact holes of the stacked body 15a and the stacked body 15b are formed using, for example, a photolithography method. Subsequently, a metal material or the like is embedded in the contact holes having been provided to the stacked body 15a and the stacked body 15b to form the contacts 32.

Subsequently, the wafer is curved up by dicing into two or more semiconductor memory devices 1.

The semiconductor memory device 1 is manufactured in such a manner as described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
   a substrate;
   a stacked body provided on the substrate, and including a plurality of electrode films stacked separately from each other; and
   a plurality of columnar parts provided in the stacked body, and each including, a semiconductor pillar extending in a stacking direction of the stacked body, and a charge storage film provided between the semiconductor pillar and the stacked body,
   the plurality of electrode films including a plurality of first electrode films provided in upper layers of the stacked body and a plurality of second electrode films provided in lower layers of the stacked body,
   at least one of the first electrode films having, a first thickness, which is a smallest thickness of thicknesses of the first electrode films,
   at least one of the second electrode films having a second thickness, which is a largest thickness of thicknesses of the second electrode films,
   the first thickness being, thicker than the second thickness, and
   in a case of defining the first thickness as L1a, a width of the columnar part disposed in the first electrode film as W1a, a distance between centers of the columnar parts adjacent to each other disposed in the first electrode film as W2a, the second thickness as L2a, a width of the columnar part disposed in the second electrode film as W2a, and a distance between centers of the columnar parts adjacent to each other disposed in the second electrode film as d2a, the following two formulas are fulfilled, $$d1a - W1a < L1a$$

$$d2a - W2a \geq L2a.$$

2. The device according to claim 1, wherein
   a width of the columnar part disposed in the first electrode films is larger than a width of the columnar part disposed in the second electrode films.

3. The device according to claim 1, further comprising:
   a plurality of contacts provided to the respective electrode films,
   a shape of an end part of the stacked body being a stepped shape provided with steps for the respective electrode films, and
   the plurality of contacts being provided to the end part.

4. The device according to claim 1, wherein
   the plurality of electrode films is divided into a first set having the plurality of first electrode films, a second set having the plurality of second electrode films, and a third set provided between the first set and the second set and having a plurality of third electrode films, at least one of which has a third thickness, and
   the third thickness is thinner than the first thickness and thicker than the second thickness.

5. The device according to claim 4, wherein
   a width of the columnar part disposed in the first electrode films is larger than a width of the columnar part disposed in the second electrode films and a width of the columnar part disposed in the third electrode films.

6. The device according to claim 4, wherein
   the first electrode films each have the first thickness,
   the second electrode films each have the second thickness, and
   the third electrode films each have the third thickness.

* * * * *